(12) United States Patent
He et al.

(10) Patent No.: US 7,430,442 B2
(45) Date of Patent: Sep. 30, 2008

(54) MINIATURE BIDIRECTIONAL AMPLIFIER

(76) Inventors: Shiping He, 603 Eisenhower Dr., Frederick, MD (US) 21703; Jie Hang, 2 Choke Cherry Rd., Rockville, MD (US) 20850; David Ge, 13111 Pincy Knoll La., Potomac, MD (US) 20854; Mohammed N. Jamal, 11241 Minstral Tune Dr., Germantown, MD (US) 20876

( * ) Notice: Subject to any disclaimer, the term of this patent is extended or adjusted under 35 U.S.C. 154(b) by 108 days.

(21) Appl. No.: 11/121,814

(22) Filed: Apr. 29, 2005
(Under 37 CFR 1.47)

(65) Prior Publication Data
US 2006/0063508 A1  Mar. 23, 2006

Related U.S. Application Data

(60) Provisional application No. 60/664,546, filed on Mar. 24, 2005, provisional application No. 60/566,595, filed on Apr. 30, 2004.

(51) Int. Cl.
*H04M 1/00* (2006.01)

(52) U.S. Cl. ............... 455/575.1; 455/562.1; 455/575.7; 455/575.8; 455/90.3

(58) Field of Classification Search .............. 455/575.1, 455/562.1, 575.7, 575.8, 90.3, 414.1
See application file for complete search history.

(56) References Cited

U.S. PATENT DOCUMENTS

| | | | | |
|---|---|---|---|---|
| 3,689,842 A | * | 9/1972 | Meed | |
| 3,875,465 A | * | 4/1975 | Riedel | 361/120 |
| 4,429,417 A | * | 1/1984 | Yool | 455/291 |
| 4,430,757 A | * | 2/1984 | Szakvary | |
| 4,701,726 A | * | 10/1987 | Holdsworth | 333/185 |
| 4,763,076 A | * | 8/1988 | Arakawa et al. | 324/322 |
| 4,833,419 A | * | 5/1989 | Chrystie | 330/59 |
| 6,429,830 B2 | * | 8/2002 | Noro et al. | 343/895 |
| 6,524,524 B1 | * | 2/2003 | Lin | 419/9 |
| 7,173,608 B2 | * | 2/2007 | Ranjan | 345/179 |
| 2002/0031243 A1 | * | 3/2002 | Schiller et al. | 382/119 |
| 2002/0080087 A1 | * | 6/2002 | Takatori et al. | |
| 2004/0190467 A1 | * | 9/2004 | Liu et al. | 370/311 |
| 2005/0225397 A1 | * | 10/2005 | Bhatia et al. | 330/311 |

* cited by examiner

*Primary Examiner*—Matthew Anderson
*Assistant Examiner*—Minh Dao
(74) *Attorney, Agent, or Firm*—Cahn & Samuels, LLP

(57) ABSTRACT

An amplifier device for amplifying RF communication signals compatible with IEEE 802.11 standards. An amplifier circuit is housed within a cylindrical metal housing that provides excellent heat dissipation and requires no mounting hardware for installing the device within a communication system. The metal housing with an integrated lightning arrestor creates a watertight seal to protect the amplifier circuit from damage when installed outdoors and the amplifier circuit is compatible with both 2.4 GHz and 5.8 GHz frequency applications.

14 Claims, 7 Drawing Sheets

MINIATURE BIDIRECTIONAL AMPLIFIER

CROSS REFERENCE TO RELATED APPLICATIONS

This application is an application filed under 35 U.S.C. § 111(a) claiming benefit pursuant to 35 U.S.C. § 119(e)(1) of two Provisional Applications, Ser. No. 60/566,595 filed on Apr. 30, 2004 and Ser. No. 60/664,546 filed Mar. 24, 2005, which were filed pursuant to 35 U.S.C. § 111(b), the entire contents of which are incorporated herein by reference.

FIELD OF THE INVENTION

This invention relates generally to a bi-directional amplifier used for wireless communications. More particularly, the invention relates to a miniature bi-directional amplifier housed in a specially-shaped, rugged, water-proof housing that permits ease of handling and outdoor use and also provides heat-dissipation for circuitry housed within.

BACKGROUND OF THE INVENTION

Before providing specific background information in regard to the specific invention disclosed below, a brief general background is provided along with a few definitions for terms relevant to the discussion below.

In particular, 802.11 refers to a family of standards developed by the Institute of Electrical & Electronic Engineers (IEEE) for wireless Local Area Network (LAN) technology. The 802.11 standards specify an over-the-air interface between a wireless client and a base station or between two wireless clients.

There are several specifications in the 802.11 family. For example, basic 802.11 applies to wireless LANs and provides 1 or 2 Mbps transmission in the 2.4 GHz frequency band using either frequency hopping spread spectrum (FHSS) or direct sequence spread spectrum (DSSS).

802.11a is an extension to 802.11 that also applies to wireless LANs and provides up to 54 Mbps in the 5 GHz frequency band. 802.11a uses an orthogonal frequency division multiplexing (OFDM) encoding scheme rather than FHSS or DSSS.

802.11b, also referred to as 802.11 High Rate or Wi-Fi, is an extension to 802.11 that applies to wireless LANs and provides 11 Mbps transmission (with a fallback to 5.5, 2 and 1 Mbps) in the 2.4 GHz frequency band. 802.11b uses only DSSS.

802.11 g also applies to wireless LANs and provides 20+ Mbps transmission in the 2.4 GHz frequency band.

Communication systems designed around the 802.11 standards typically utilize amplifier devices for amplifying the RF signals. Due to restrictions mandated by the Federal Communications Commission (FCC) in the United States, the output power of most transmitters must be amplified before the Radio Frequency (RF) signal is transmitted via an antenna over the air. Several amplifier devices have been proposed for this purpose. However, conventional amplifiers typically comprise large bulky enclosures with big metal fins used for dissipating heat generated by the amplifier circuits. If the heat generated by the amplifier circuit is not dissipated properly by the casing of the amplifier circuit, the temperature will rise so high that some, if not all, of the electrical components comprising the amplifier will burn out and become inoperable. Further, high temperatures within the amplifier increase the collector charge and current gain of the RF components. High collector charge and current gain will decrease the performance of these components and force the equipment to malfunction. To address this issue, RF designers have conventionally used heavy bonded fins to dissipate the heat out of the amplifiers. This type of heatsink limits the mobility of the amplifier and, hence, the applications in which it can be used.

Additionally, conventional amplifiers are large and bulky and often do not provide provisions against lightning strikes. Since oftentimes this type of amplifier is located outdoors, it is often the case where the metal used to house the amplifier, or the cables leading to and from the amplifier, will attract lightning. If lightning strikes the amplifier, either directly or indirectly, and the device does not have provisions for dissipating the electricity, the results are typically fatal for the amplifier and, potentially, other equipment downstream from the amplifier. It has been suggested to provide lighting arrestors installed between the amplifier and the antenna. The addition of the lightning arresting device separate from the amplifier not only increases the overall expense, but it also increases the installation time necessary to install the system.

SUMMARY OF THE INVENTION

Illustrative, non-limiting embodiments of the present invention overcome the aforementioned and other disadvantages associated with related art amplifiers used in the field of wireless communication. Also, the present invention is not required to overcome the disadvantages described above and an illustrative non-limiting embodiment of the present invention may not overcome any of the problems described above.

It is an aspect of the present invention to provide a small, lightweight amplifier device that is compatible with various 802.11 standards.

It is a further aspect of the invention to provide an amplifier casing that provides sufficient heat dissipating capabilities to ensure that the amplifier circuitry does not overheat when in operation.

It is a further aspect of the invention to provide an amplifier that is easy-to-install and service.

It is a further aspect of the invention to provide an amplifier that includes a lightning arrestor integrated within the device packaging.

It is a further aspect of the invention to provide an amplifier that can be used either indoors or outdoors and in inclement weather.

Specifically, it is desired to provide an amplifier device including a circuit for amplifying a wireless communication signal with a cylindrical metal housing enclosing the circuit.

It is further desired to provide an amplifier device that includes circuit means mounted on a printed circuit board for amplifying a wireless communication signal, wherein the printed circuit board is less than eleven and a half square centimeters in area.

It is further desired to provide a bi-directional amplifier device that can receive and transmit RF signals compatible with one or more of the IEEE 802.11 standards, the amplifier device including an amplifier circuit and an enclosure device operable to house the amplifier circuit, wherein heat generated by the amplifier circuit when in operation is sufficiently dissipated through an outer cylindrical surface of said enclosure device such that no additional heat dissipation devices are required to ensure proper operation of the amplifier circuit.

It is also further desired to provide an enclosure for housing an RF amplifier circuit, the enclosure including a cylindrical first portion on which the RF amplifier circuit is mounted and a hollow cylindrical second portion which covers the RF amplifier circuit and which creates a seal with the cylindrical first portion, wherein the seal is at least one of air-tight and water-tight.

Lastly, it is desired to provide a communication system including a radio operable to generate RF transmission signals onto an RF cable, an AC adapter operable to generate a DC power signal, wherein the RF transmission signal and the DC power signal coexist on the RF cable and a bi-directional amplifier circuit operable to amplify the RF transmission signal on the RF cable and provide the amplified RF transmission signal to an antenna, receive a receive RF signal from the antenna and amplify the receive RF signal, and derive operational power from the DC power signal on the RF cable.

As used herein "substantially", "generally", and other words of degree, are used as a relative modifier intended to indicate permissible variation from the characteristic so modified. It is not intended to be limited to the absolute value or characteristic which it modifies but rather approaching or approximating such a physical or functional characteristic.

BRIEF DESCRIPTION OF THE DRAWINGS

The aspects of the present invention will become more readily apparent by describing in detail illustrative, non-limiting embodiments thereof with reference to the accompanying drawings, in which.

DETAILED DESCRIPTION OF ILLUSTRATIVE, NON-LIMITING EMBODIMENTS

Exemplary, non-limiting, embodiments of the present invention are discussed in detail below. While specific configurations and dimensions are discussed to provide a clear understanding, it should be understood that the disclosed dimensions and configurations are provided for illustration purposes only. A person skilled in the relevant art will recognize that other dimensions and configurations may be used without departing from the spirit and scope of the invention.

Figure 1:
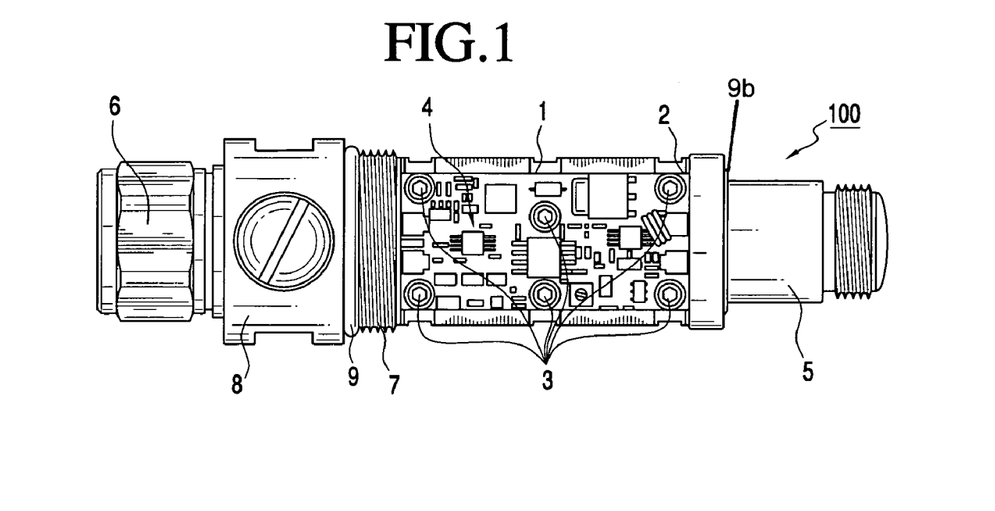
FIG. 1 is an illustration of one embodiment of an open miniature bi-directional amplifier in accordance with the present invention.

FIG. 1 illustrates an amplifier device 100 in accordance with one embodiment of the present invention. As shown in FIG. 1, amplifier 100 includes a printed circuit board (PCB) 1 mounted to a substantially flat part of a mounting portion 2 of a metal enclosure device. The PCB 1 is mounted to the metal enclosure device in the present embodiment using metal screws 3; however, a skilled artisan would understand that other mounting techniques are also suitable. For example, epoxy, rivets, and mating releasably interlocking elements disposed on the enclosure and the PCB may also be used to attach the PCB to the enclosure device.

PCB 1 in this embodiment is a multi-layer printed circuit board with dimensions that are approximately 1.9 cm by 3.8 cm (¾ inch by 1½ inches) and which provides a substrate for an amplifier circuit 4. Circuit 4 will be discussed in further detail below in reference to FIGS. 6 and 7. However, it should be noted at present that circuit 4 is a bi-directional amplifier circuit that provides signal amplification for signals transmitted and received in accordance with the 802.11b and 802.11g standards mentioned above. For example, the frequency range of signals that can be amplified by circuit 4 is approximately 2.4 to 2.5 GHz. Of course, one skilled in the art would know that other ranges of frequencies are possible for an amplifier circuit in accordance with the present invention and it is not necessarily required that the amplifier be compatible with 802.11.

Additionally, it should be noted that an amplifier circuit in accordance with the present invention may or may not include an Automatic Gain Control (AGC) circuit to maintain output signal levels within a predetermined range. For example, the AGC circuit disclosed in U.S. Pat. No. 6,681,100, which is incorporated herein by reference for all that it teaches and which is assigned on its face to Teletronics International, Inc., the same assignee as the instant application, can be incorporated into the amplifier circuit disclosed herein.

At one end of the PCB 1 is a connector 5 for connecting the amplifier circuit 4 to either a signal generation part of a communication system of a signal transmission portion of the system. As shown, for example, in FIG. 1, connector 5 can be an N-type female connector commonly known in the art. At the other end of the PCB 4 is a second connector 6, which is also for connecting the amplifier circuit 4 to either a signal generation part of a communication system or a signal transmission portion of the system. As shown, for example, in FIG. 1, connector 7 can be an N-type male connector as commonly known in the art.

Between the PCB 4 and connector 6 is a threaded portion 7 which engages a cover portion, discussed hereinafter. Adjacent to threaded portion 7 is an O-ring 9 which contacts the inside surface of the cover portion when the cover portion is placed over the mounting portion of the metal enclosure device. As the cover portion is rotated onto the threaded portion 7, O-ring 9 creates a watertight and/or airtight seal between the cover portion and the mounting portion of the metal enclosure device. Accordingly, PCB 1 is protected from adverse environmental conditions which might otherwise damage PCB 1 and/or amplifier circuit 4 if permitted to come into contact with PCB 1.

Between gasket 9 and connector 6 is section 8 of the metal enclosure device. In accordance with the present embodiment, reference number 8 (FIG. 5) on the metal enclosure device indicates a portion of the enclosure device that houses a gas tube. The gas tube acts as a lightning protection arrestor. Inside the gas tube is an inert gas comprising one or more different gases. The quantity and mix of gases used in the gas tube determines the breakdown voltage rating of the device. The precise mixture of gases is determined in such a way that when a voltage potential of a pre-determined nature is introduced to the gas tube, the gases within the tube ignite and burn, causing a very low resistance to occur. For example, when the gases ignite, a virtual short-circuit is created until the voltage ignition source is removed. According to the present embodiment, the gas tube is small enough to be integrated into the metal enclosure device and, thus, the need to install such a lightning arrestor external to the amplifier device is avoided.

The overall length of the cylindrical metal enclosure device in accordance with the present embodiment is approximately 10.9 cm (4.3 inches) and the diameter is approximately 3.0 cm (1.2 inches).

Figure 2:
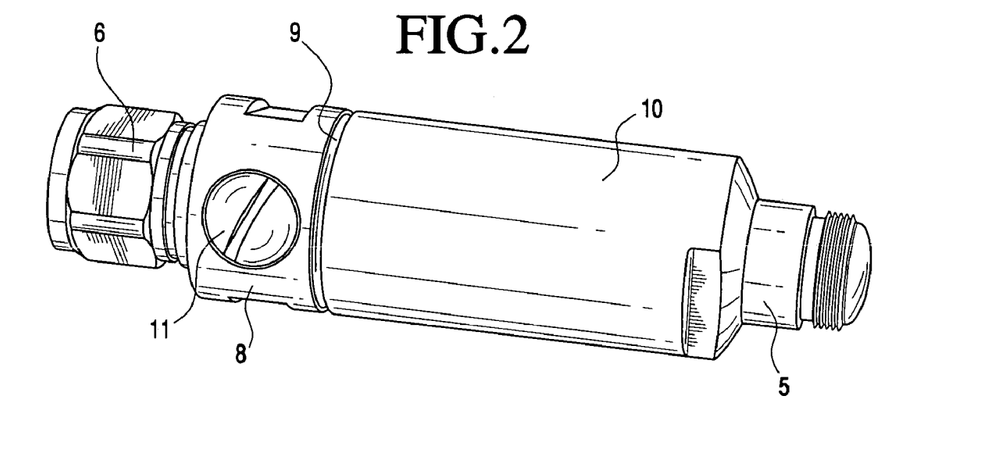
FIG. 2 is an illustration of one embodiment of a closed miniature bi-directional amplifier in accordance with the present invention.

FIG. 2 illustrates an amplifier consistent with the embodiment of FIG. 1 with a cover portion 10 in place. That is, cylindrical metal cover portion 10 is placed over one end of the mounting portion of the metal enclosure device and rotated onto threaded portion 7 (FIG. 1). As illustrated in FIG. 2, O-ring 9 is compressed when cover 10 is tightened onto threaded portion 7. Another O-ring (9b in FIG. 1) can also be placed on the enclosure device at the opposite side of the PCB to engage the cover 10 and create a similar seal. As discussed previously, as cover 10 is rotated, or screwed, onto threaded portion 7 (FIG. 1), O-ring 9 creates a seal between the cover 10 and portion 8 of the mounting portion of the metal enclosure. Sealing the enclosure in this manner protects PCB 1 from being exposed to water or other damaging environmental conditions external to the enclosure. Accordingly, an amplifier in accordance with the present invention is suitable for use outdoors. As also shown in FIG. 2, section 8 of the metal enclosure device includes an access panel, shown for example in this embodiment as a screw-type access panel, for providing access to the gas tube for repair or replacement purposes. Other means for providing an access panel for the gas tube, other than a screw-type panel, would be known to those skilled in the art.

Additionally, in regard to conventional amplifiers, during the installation process, the installer has to use proper mounting hardware to install the amplifiers in the whole system. The amplifiers are either mounted on the solid surface or the standing tower. Due to the complexity of RF signal, people who install the amplifiers are required to have adequate knowledge of RF fields so that the amplifiers are installed properly. As illustrated in FIG. 2, however, an amplifier in accordance with the present invention requires no screws or mounting brackets. All that the installer needs to do is connect the RF cables to the antenna and the transmitting device and make sure the case is sealed correctly. People with minimum RF knowledge can perform the installation work easily without decreasing the functional ability of the present amplifier device.

Figure 3:
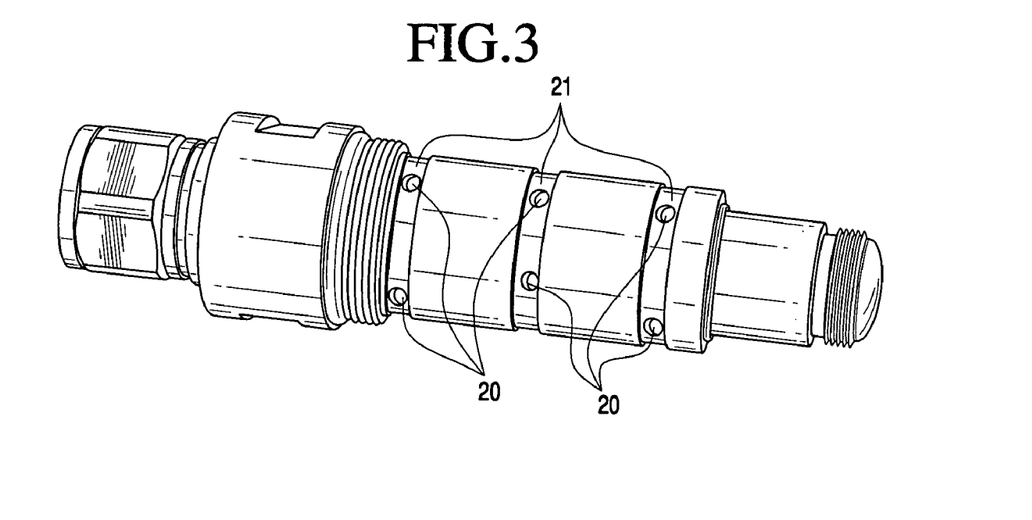
FIG. 3 is an illustration the open miniature bi-directional amplifier of FIG. 1 shown from a different angle.

FIG. 3 illustrates the underside of mounting portion 2 of the metal enclosure device. As illustrated in this embodiment, six holes 20 are provided for receiving screws 3 (FIG. 1). The use of screws 3 (FIG. 1) provides the additional benefit of serving as a heat-sink. That is, they conduct heat from the PCB 1 (FIG. 1) through holes 20 and into corresponding channels 21, which according to the present embodiment are machined into the underside of mounting portion 2 of the metal enclosure device. Channels 21 run from one side of the metal enclosure device, adjacent to a side of PCB 1, around to the other side of the metal enclosure device, adjacent to the other side of PCB 1. As heat is transferred into channels 21, some of the heat is carried through the channels and into the area above PCB 1 and dissipated through the metal cover 10 (FIG. 2). Additional heat is transferred directly into the cover 10 and dissipated through the cover to the outside environment.

Heat is generated when electrical current passes through the components of amplifier circuit 4 (FIG. 1). In accordance with the present invention, the heat generated by the amplifier circuit is efficiently and conveniently dissipated by virtue of the shape of the metal enclosure device. More particularly, the metal enclosure device of the present amplifier is designed as a cylindrical metal shell. However, other configurations for the enclosure are also contemplated in accordance with the present invention. Also, a highly thermally conductive metal is preferred in accordance with the present embodiment. For example, in the present embodiment, copper is used to make the shell due to the high amount of thermal conductivity exhibited by copper.

Due to the unique configuration of the amplifier enclosure of the present embodiment, the heat is dissipated away from the amplifier circuit via conduction and radiation. Because copper has excellent conductivity, the rate of heat dissipation is increased. In addition, a metallic coating disposed over the copper enhances the heat radiation of the copper. Accordingly, because the metal enclosure device provides such excellent heat dissipation, unlike conventional amplifiers, a large, heavy and expensive heat sink, typically made of bonded fins, is not necessary.

Figure 4:
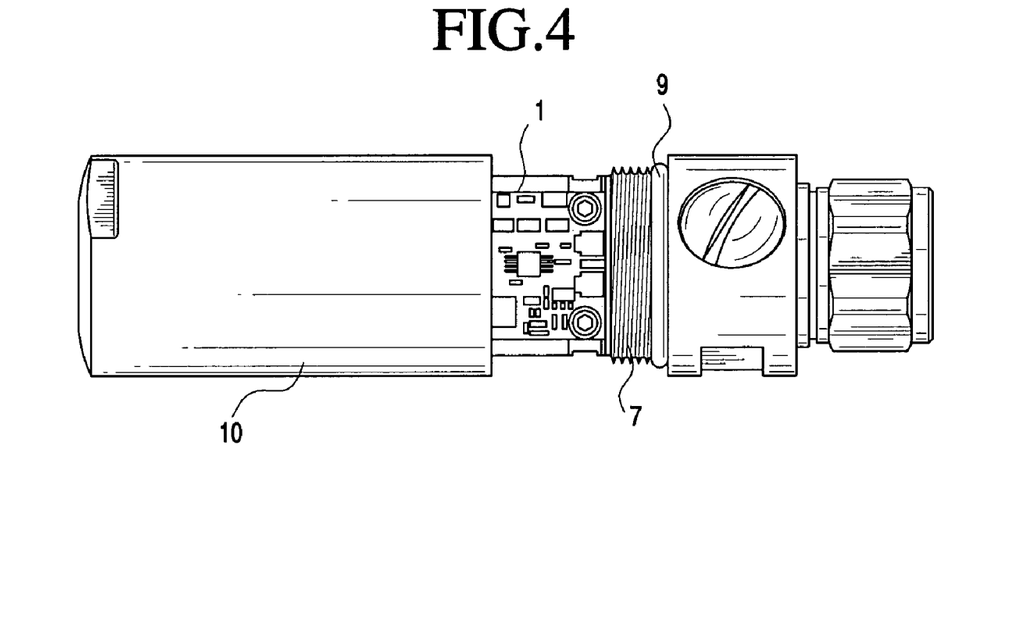
FIG. 4 is an illustration of the miniature bi-directional amplifier of FIGS. 1 and 2 where the cover is partially removed.

FIG. 4 illustrates an amplifier device in accordance with the present invention where the cover 10 has been partially removed from the mounting section of the metal enclosure device, thereby partially exposing PCB 1. Cylindrical cover 10 has openings at either end. The opening at one end of cover 10 has a diameter substantially equal to the diameter of the cylindrical cover. Threads (not illustrated) are disposed on the inner wall of this end of the cover and mate with the threaded portion 7 of the mounting portion of the enclosure device. The opening at the other end of cover 10 has a diameter that is smaller than the diameter of the cylindrical cover. This smaller opening fits over the connector 5 at the end of the mounting portion of the enclosure device to permit the connector to extend out beyond the end of the cover.

Figure 5:
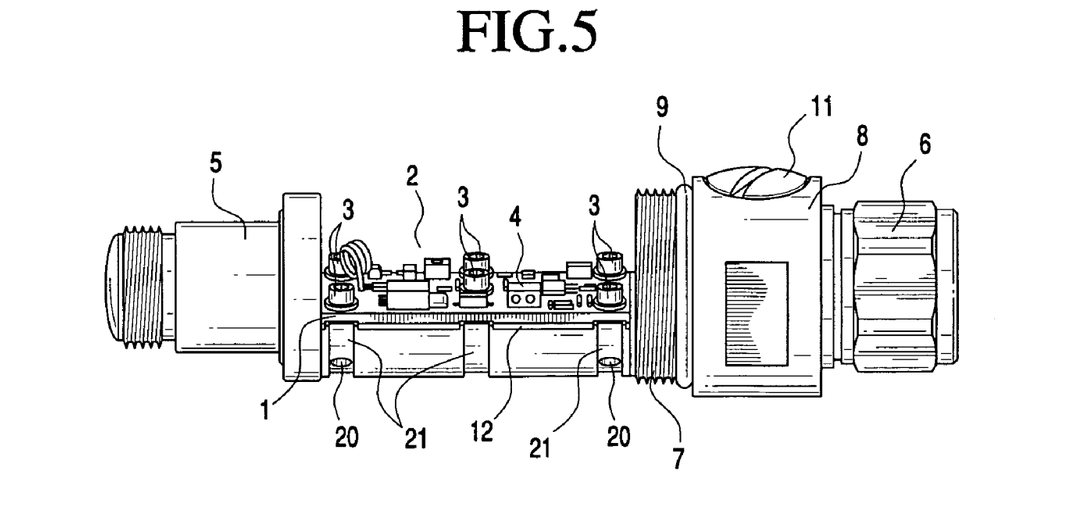
FIG. 5 is an illustration the closed miniature bi-directional amplifier of FIG. 2 where the cover is completely removed.

FIG. 5 illustrates a sideview of an amplifier device in accordance with the present invention. As seen in FIG. 5, according to the present embodiment, mounting portion 2 of the metal enclosure device includes an open section that is cut out of the midsection of the metal cylindrical metal enclosure device. PCB 1 is mounted to the flat portion of the cut out section via screws 3. As illustrated, screws 3 are inline with channels 21 on the underside of the enclosure device. A gap 12 is provided between the top, flat, portion of mounting section 2 and the bottom of PCB 1. This air gap 12 permits heat to dissipate from under the PCB and into the air gap above PCB 1. As discussed previously, some of the heat generated by the PCB is conducted through the metal screws and into the channels 21. This heat is then dispersed around the circumference of the mounting portion of the enclosure device. The heat then dissipates through cover 10 (FIG. 4) and into the external environment. Heat dissipation is an important aspect of the present invention and due to the unique cylindrical design of the enclosure device, heat is able to disperse around the entire circumference of the enclosure device and dissipate quickly and efficiently to the external environment, avoiding the need for bulky heat sinks.

Figure 6:
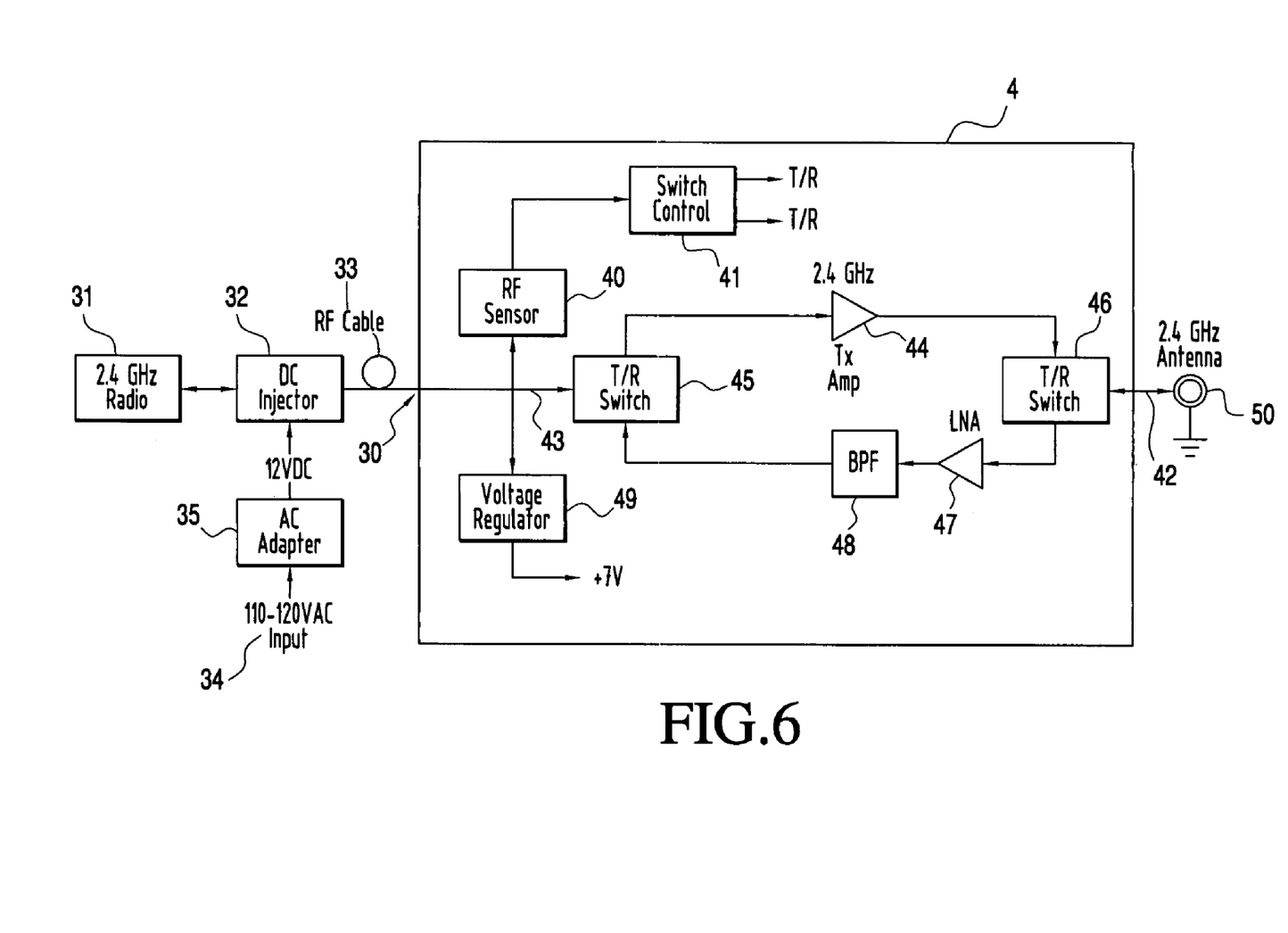
FIG. 6 is block diagram of an amplifier circuit in accordance with the present invention.

FIG. 6 is a block diagram of an amplifier circuit 4 in accordance with the present invention. The present embodiment is compatible with the 802.11b and 802.11g standards and operates in the 2.4 GHz frequency range. Specifically, RF input is received at the amplifiers input/output port 30. The RF input signal is generated by a 2.4 GHz radio source 31 and an optional DC injector 32 provides a DC voltage on the same RF cable 33 which carries the RF signal. The DC voltage injected provides the necessary operational power to the devices of the amplifier circuit 4 without requiring separate power cables or separate input ports on the amplifier device. As shown in the present embodiment, the DC injection signal is generated by a standard 110-120 volt AC source 34 and converted to 12 volts DC in an AC adapter 35.

At the opposite end of amplifier circuit 4 is a second input/output port 42 which is electrically connected to an antenna 50. Antenna 50 is operable to transmit and receive RF signals.

Within amplifier circuit 4 is an RF sensor 40 which senses the level of the RF signal on line 43. The output of RF sensor 40 is provided to switch control circuitry 41 which, based on the sensed RF level from RF sensor 40, determines whether the amplifier circuit 4 should be in transmit mode or in receive mode. If switch control 41 determines that the amplifier device should be in transmit mode, switch control 41 controls transmit/receive switch 45 to pass the signal present on line 43 through to transmit amplifier 44. Additionally, if in transmit mode, switch control 41 controls T/R switch 46 to pass the amplified RF signal from the output of transmit amplifier 44 to input/output port 42. The outputted amplified signal is then transmitted via antenna 50.

If, on the other hand, it is determined by switch control 41 that the amplifier circuit 4 should be in receive mode, switch control 41 then controls T/R switch 46 to pass a received RF signal, received via antenna 50, through to low-noise amplifier (LNA) circuit 47. LNA 47 amplifies the received RF signals to a level necessary for the receiver electronics (not shown). After the received RF signal is amplified in LNA 47, the amplified signal is input to band-pass filter (BPF) circuit 48. A band pass filter is a filter that passes frequencies in a desired range and attenuates frequencies below and above that range. Once the desired frequency range of signals has been extracted by BPF 48, the resulting signal is sent to T/R switch 45. In receive mode, i.e., when switch control 41 determines that the amplifier circuit 4 should be in receive mode, switch 41 controls T/R switch 45 to pass received signals from BPF 48 through to input/output port 30 and on to the receive electronics.

Figure 7:
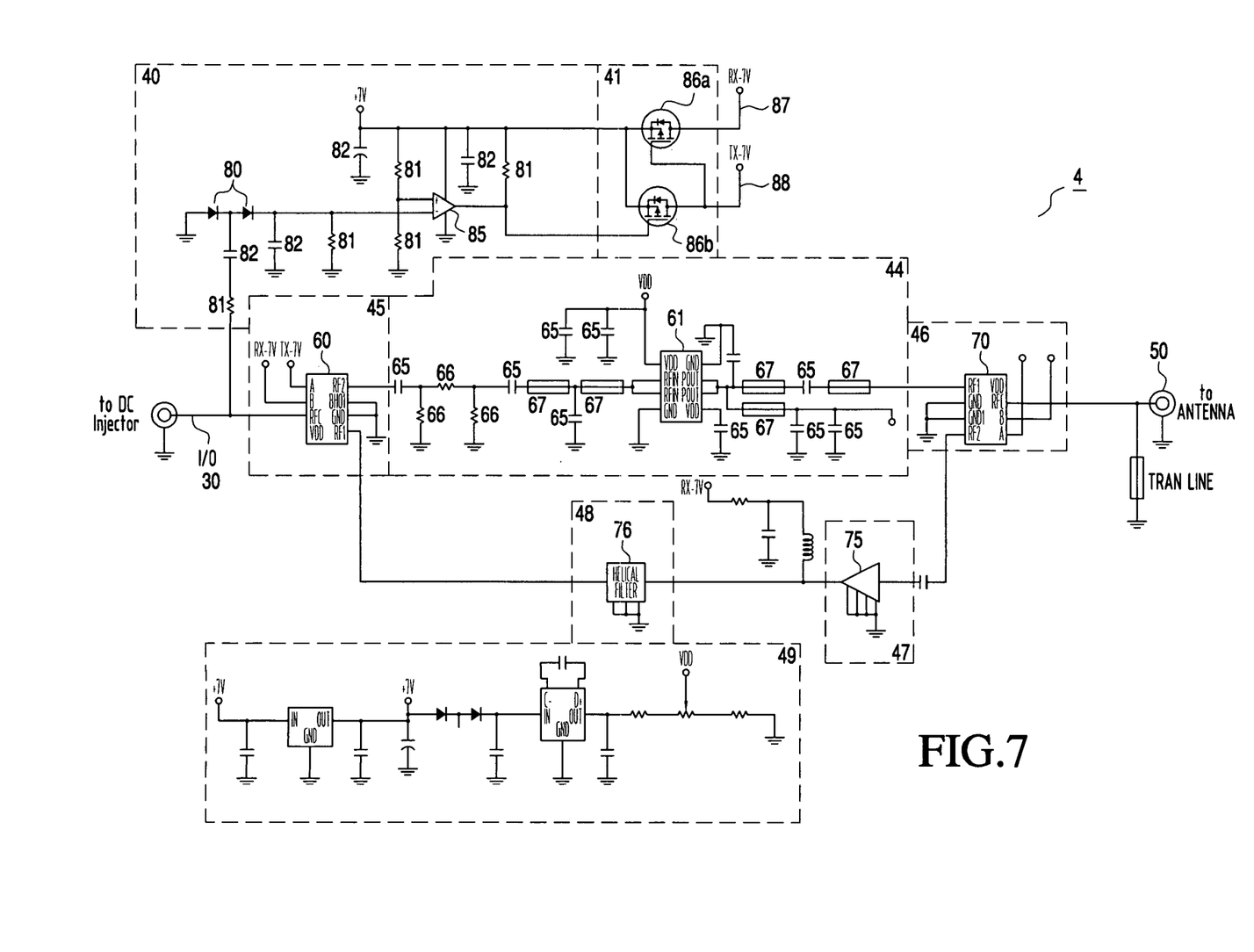
FIG. 7 is a detailed schematic of an amplifier circuit in accordance with the present invention.

FIG. 7 is a detailed schematic of an exemplary amplifier circuit 4 (FIG. 1) in accordance with the present invention. It should be noted that the specific circuit elements shown in FIG. 7 and mentioned below in the description are exemplary. A skilled artisan would know that other alternative components and configurations of components could also be used in accordance with the invention. For convenience, each of the numbered functional blocks of the block diagram of FIG. 6 is referenced in FIG. 7.

In accordance with the present embodiment, the RF signal input at input/output port 30 is presented to the RF sensor circuit 40, which comprises various electrical components, such as diodes 80, resistors 81, capacitors 82 and a comparator circuit 85. A non-limiting exemplary component that could be used for comparator circuit 85 is part number LMV331 from National Semiconductor of Santa Clara, Calif.

By virtue of comparator circuit 85, the level of the signal present at input/output port 30 is compared to a predetermined, known value, which is determined by several of the circuit elements 81 and 82 and the DC voltage input via the DC injector. If the value of the signal at input/output port 30 is higher than the predetermined known value, it is determined that the amplifier circuit 4 should be in transmit mode. For example, under these circumstances, it is determined that an RF signal has been input to input/output port 30 for transmission on antenna 50. Accordingly, the output of the comparator circuit 85 drives switch control circuit 41 to, in turn, provide drive signals to various other portions of the amplifier circuit 4, including switch devices 60 and 70.

In particular, the output of comparator 85 is connected to the source of one FET transistor, 86a, which activates a receive mode enable signal 87 at the drain of transistor 86a. The output of comparator 85 is also connected to the gate of a second FET transistor, 86b, which drives a transmit mode enable signal 88 from the drain of transistor 86b. The drain of transmit transistor 86b is also connected to the gate of receive transistor 86a to insure proper reverse polarity of the enable signals 87 and 88. A suitable non-limiting exemplary transistor to use for transistors 86a and 86b is Motorola part number MGSF1P02LT1, which is a miniature surface mount MOSFET and which provides minimal power loss and conserves energy.

Within amplifier circuit 4, the RF signal input at input/output port 30 is also presented to switch circuit 45, which comprises switch device 60. Switch device 60, in this exemplary embodiment, is a low-cost single-pole double throw (SPDT) switch in an 8-lead MSOP package. One known device for this application is part number HMC174MS8, manufactured by Hittite Microwave Corporation of Chelmsford, Mass. Switch device 60 can handle signals from DC to approximately 3.0 GHz and is particularly suited for 2.4 GHz industrial, scientific and medical (ISM) applications with only 0.5 dB loss.

In accordance with the present embodiment of the invention, switch device 60, which makes up a substantial portion of T/R switch block 45 of FIG. 6, should ideally provide very good intermodulation performance. For example, switch 60 ideally provides a +60 dBm third order intercept at 8 volt bias. Circuitry within the switch device itself permits single positive supply operation while drawing very low DC current with control inputs that are compatible with CMOS and TTL logic families.

As discussed above, switch 60 is a bi-directional device which permits RF energy to pass either from a first input/output (I/O) port to a second I/O or from a third I/O port to the first I/O port, depending on the level of the control signals input. In particular, receive mode enable signal 87 and transmit mode enable signal 88 are input to switch device 60 to determine the operation of the switch.

If switch 60 is in transmit mode, i.e., transmit mode enable signal 88 is active and receive mode enable signal 87 is inactive, RF energy is passed through the switch from its first I/O port to its second I/O port and on to transmit amplifier circuit 44. As shown in FIG. 7, transmit amplifier circuit 44 includes various capacitors 65, resistors 66 and transmission lines 67 connected to an integrated circuit amplifier device 61 which is ideally designed for use in low cost, high volume, 2.4-2.5 GHz ISM band applications. For example, one suitable non-limiting exemplary device is an amplifier manufactured by Teletronics International, Inc. of Rockville, Md., part number TC3151. This amplifier is a 2 stage Pseudomorphic High Electron Mobility Transistors (PHEMT) configured as a Monolithic Microwave Integrated Circuit (MMIC).

The MMIC provides a typical gain of approximately 28 dB and saturation power of more than 34 dBm. A typical bias condition for this device is 7 volts at 800 mA. The MMIC is packaged in a standard SO-8 power package. The copper based carrier of the package allows direct soldering of the device to the PCB for proper heat dissipation, discussed above. The Teletronics MMIC amplifier is particularly well-suited for the present invention because the input and output matching of the MMIC require minimum external components. Accordingly, it is possible to minimize the size of the PCB and, ultimately, of the amplifier device itself.

Once the inputted RF signal is amplified via transmit amplifier circuit 44, the amplified result is passed to switch circuit 46. Switch circuit 46 is similar to switch circuit 45 except that its configuration is reversed. More particularly, switch circuit 46 comprises switch device 70 which, according to the present embodiment can be the same type of device as switch device 60. The amplified RF signal from transmit amplifier circuit 44 is provided to switch device 70 on one of its input/output ports. When amplifier circuit 4 is in transmit mode, switch device 70 is controlled to pass the amplified RF signal from this input/output port through to another of its input/output ports which is connected to an antenna 50.

When amplifier circuit 4 is in receive mode, i.e., transmit mode enable signal 88 is inactive and receive mode enable signal 87 is active, antenna 50 receives RF signals transmitted from other transmission systems (not shown) and passes the received signal to switch circuit 46. Switch circuit 46 comprises switch device 70 which, when controlled to be in receive mode, i.e., when transmit mode enable signal 88 is inactive and receive mode enable signal 87 is active, switch 70 passes the received RF signal from the input/output port connected to antenna 50 on to LNA circuit 47. LNA circuit 47 comprises an integrated circuit (IC) LNA 75. In accordance with this exemplary embodiment, IC LNA 75 is a GaAs MMIC amplifier with a low noise figure and excellent gain for applications from 0.5 to 6 GHz. According to the present embodiment, LNA circuit 75 is packaged in an ultra-miniature package to minimize the amount of space used on the PCB.

After the received RF signal is amplified by LNA circuit 47, the amplified result is provided to filter circuit 48 which, in accordance with the present embodiment, comprises a helical filter IC device 76. The output of helical filter is then provided to switch device 60 which, when in receive mode, transfers the output of helical filter 76 through to input/output port 30 of the amplifier where it is then provided to the receiver equipment (not shown) for processing.

Figure 8:
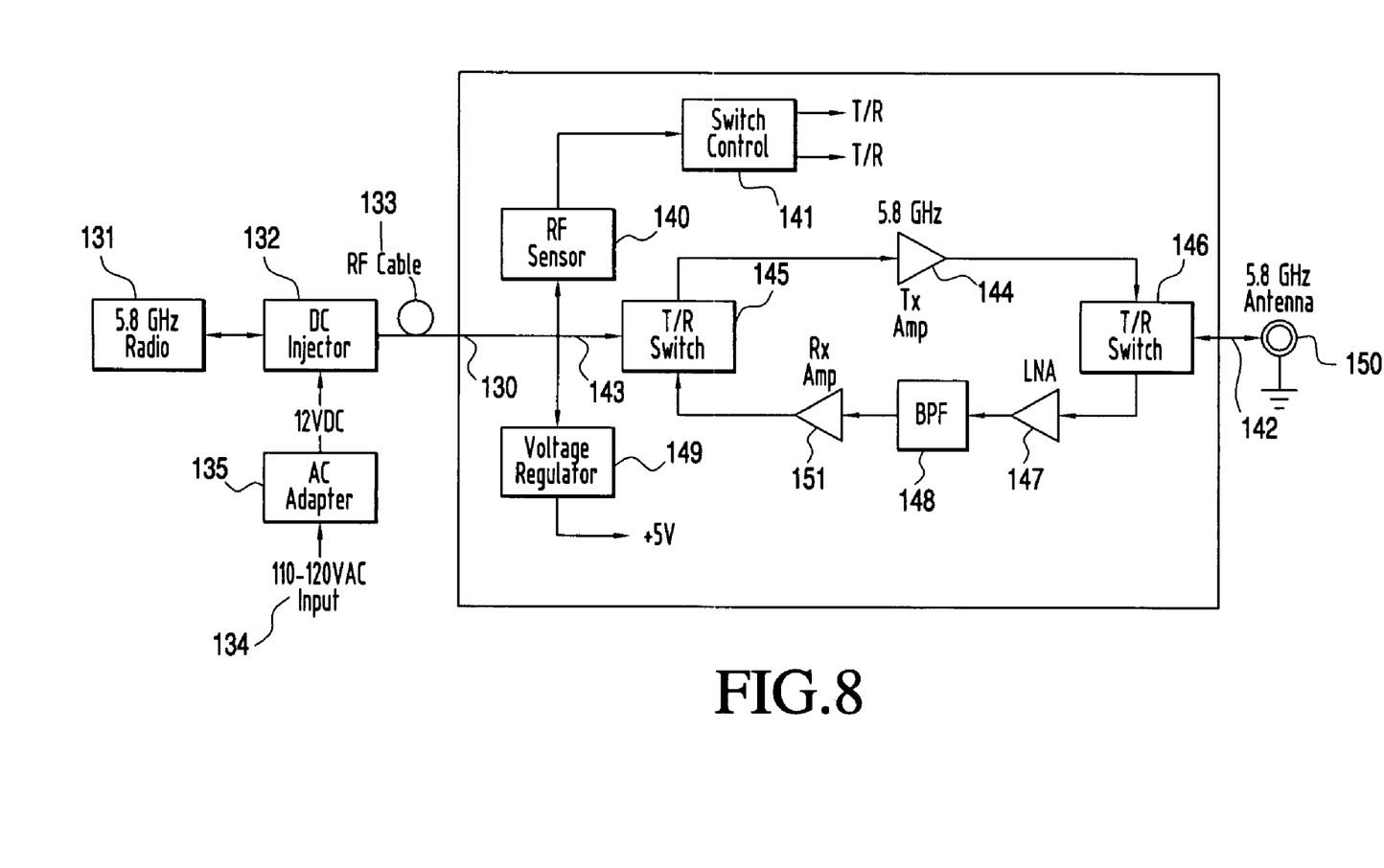
FIG. 8 is a block diagram of a further embodiment of an amplifier circuit in accordance with the present invention.

FIG. 8 is a block diagram of an alternative embodiment of the present invention. In particular, the embodiment depicted in FIG. 8 is functionally related to the embodiment of FIG. 6; however, there are significant technical differences that will be described below. For example, the exemplary embodiment illustrated in the block diagram of FIG. 8 is operative within the 5.8 GHz frequency range and is compatible with the 802.11a standard, which utilizes orthogonal frequency division multiplexing (OFDM) modulation as opposed to spread spectrum sequencing, as is the case with the exemplary embodiment of FIGS. 6 and 7. Additionally, voltage regulator 149 derives 5 volts DC instead of 7 volts DC as in the embodiment illustrated in FIG. 6. The reason for the lower voltage in the present embodiment is that the circuitry of the present embodiment is designed to use less power and only requires 5 volts DC for operation.

Because some of the basic functional blocks of FIG. 8 are somewhat similar to the functional blocks of FIG. 6, a detailed description of these blocks will be dispensed with here. However, as mentioned above and discussed in more detail below, the details of each functional block are different than those of FIG. 6. That is, the amplifier illustrated functionally in FIG. 8 and in detail in FIG. 9, is capable of operating at the full transmission speed defined by 802.11a, i.e., 54 Mbps and consumes less power than the embodiment of FIGS. 6 and 7.

One difference between the embodiment of FIG. 6 and the embodiment of FIG. 8 is that an additional receive amplifier 151 has been added to the receive path. Specifically, when the RF sensor 140 has determined that the amplifier device is receiving an RF signal from antenna 150 and, hence, T/R switch 146 is in receive mode, the received RF signal is transmitted from the antenna to the receive path comprising low-noise amplifier 147, band-pass filter 148 and receive amplifier 151. Amplifier 151 serves to additionally amplify the received signal after it has passed through LNA 147 and BPF 148. For example, in applications such as 5.8 GHz OFDM applications, it is often the case where after passing through an LNA and a band-pass filter (BPF), the signal strength is not high enough to achieve the desired output level out of the amplifier device. Because different components have different characteristics when used at different frequencies, the LNA and BPF illustrated in connection with the embodiment of FIGS. 6 and 7, e.g., at 2.4 GHz, results in different output power than if similar components are used at 5.8 GHz. Accordingly, additional Rx Amp 151 has been added to ensure proper output levels at frequencies including the 5.8 GHz range.

Figure 9:
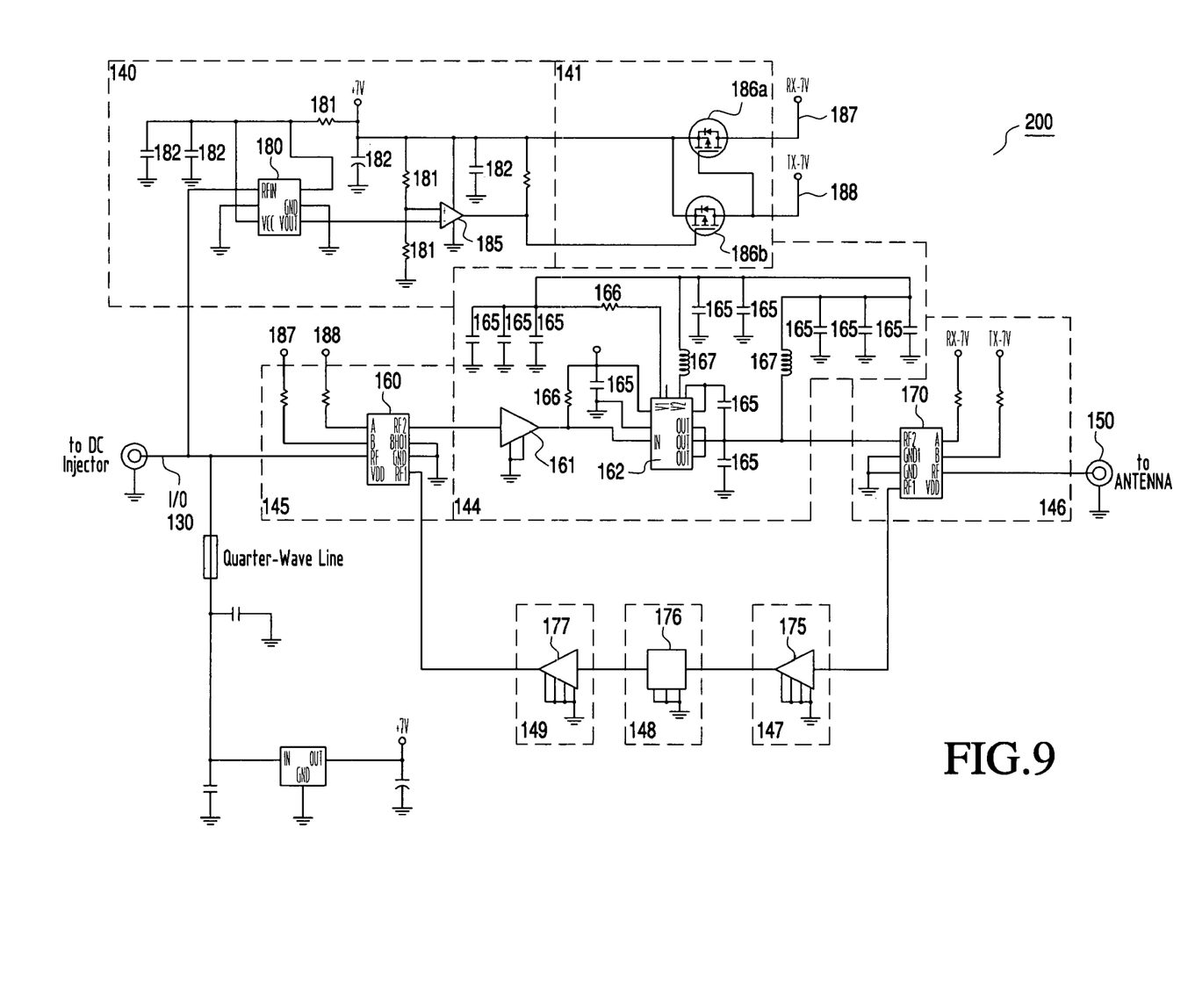
FIG. 9 is a detailed schematic of a further embodiment of an amplifier circuit in accordance with the present invention.

FIG. 9 is a detailed schematic of the alternative embodiment of an amplifier circuit 200 illustrated in block form in FIG. 8. As discussed above in regard to the embodiment that is compatible with 802.11b and 802.11g, the present embodiment, which is compatible with 802.11a, the specific circuit elements shown in FIG. 9 and mentioned below in the description are exemplary. A skilled artisan would know that other alternative components and configurations of components could also be used in accordance with the invention. For convenience, each of the numbered functional blocks of the block diagram of FIG. 8 is referenced in FIG. 9.

In accordance with the present embodiment, an RF signal input at input/output port 130 is presented to the RF sensor circuit 140, which comprises various electrical components, such as resistors 181, capacitors 182, a power detector circuit 180 and a comparator circuit 185. A non-limiting exemplary component that could be used for comparator circuit 185 is part number LMV331 from National Semiconductor Corporation and an exemplary component used for power detector circuit is part number LTC5508 from Linear Technology.

In accordance with this embodiment, the power detector circuit 180 integrates several functions, including an internally compensated buffer amplifier, an RF Schottky diode peak detector and level shift amplifier to convert the RF input signal to DC. The power detector circuit 180 ideally provides RF power detection for signals having power levels ranging from −32 dBm to 12 dBm and frequencies ranging from 300 MHz to 7 GHz, but specifically in the range of 5.7 to 5.9 GHz.

The signal at input/output port 130 is RF detected by RF detector circuit 180 and a DC voltage is output to comparator circuit 185. By virtue of comparator circuit 185, the level of the signal present at input/output port 130 is compared to a predetermined, known value, which is determined by several of the circuit elements 181 and 182 and the DC voltage input via the DC injector. If the value of the signal at input/output port 130 is higher than the predetermined known value, it is determined that the amplifier circuit 200 should be in transmit mode. For example, under these circumstances, it is determined that an RF signal has been input to input/output port 130 for transmission on antenna 150. Accordingly, the output of the comparator circuit 185 drives switch control circuit 141 to, in turn, provide drive signals to various other portions of the amplifier circuit 200, including switch devices 160 and 170.

In particular, the output of comparator 185 is connected to the source of one FET transistor, 186*a*, which activates a receive mode enable signal 187 at the drain of transistor 186*a*. The output of comparator 185 is also connected to the gate of a second FET transistor, 186*b*, which drives a transmit mode enable signal 188 from the drain of transistor 186*b*. The drain of transmit transistor 186*b* is also connected to the gate of receive transistor 186a to insure proper reverse polarity of the enable signals 187 and 188. A suitable non-limiting exemplary transistor to use for transistors 186a and 186b is Motorola's part number MGSF1P02LT1, mentioned above in regard to a different embodiment.

Within amplifier circuit 200, the RF signal input at input/output port 130 is also presented to switch circuit 145, which comprises switch device 160. Switch device 160, in this exemplary embodiment, is a low-cost single-pole double throw (SPDT) switch in an 8-lead MSOP package. One known device for this application is part number HMC224MS8, manufactured by Hittite. Switch device 160 can handle signals from 5.0 to 6.0 GHz and is particularly suited for 5.8 GHz ISM applications with only 1.2 dB loss.

As discussed above, switch 160 is a bi-directional device which permits RF energy to pass either from a first input/output (I/O) port to a second I/O or from a third I/O port to the first I/O port, depending on the level of the control signals, 187 and 188, input from switch control circuit 141. In particular, receive mode enable signal 187 and transmit mode enable signal 188 are input to switch device 160 to determine the operational direction of the switch.

If switch 160 is in transmit mode, i.e., transmit mode enable signal 188 is active and receive mode enable signal 187 is inactive, RF energy is passed through the switch from its first I/O port to its second I/O port and on to transmit amplifier circuit 144. As shown in FIG. 9, transmit amplifier circuit 144 includes various capacitors 165, resistors 166 and inductors 167, connected to a pair of integrated circuit amplifier devices 161 and 162. Amplifier 161 in this embodiment is a monolithic integrated circuit using InGaP/GaAs Heterojunction Bipolar Transistor (HBT) technology. A non-limiting exemplary device suitable to be used for amplifier 161 is part number NBB-400, manufactured by RF Micro Devices.

According to the present non-limiting embodiment, amplifier device 162 is a high efficiency GaAs InGaP HBT Power Amplifier MMIC with a 1 dB compression point (P1 dB) at +30 dBm. Amplifier 162 further provides approximately 20 dB of gain, +32.5 dBm of saturated power, and 27% Power-Added Efficiency (PAE), which is calculated as the output power minus the input power, divided by the DC power. A non-limiting exemplary device for use as amplifier 162 is part number HMC408LP3 by Hittite, which is operable in the 5.1-5.9 GHz frequency range.

Once the inputted RF signal is amplified via amplifier devices 161 and 162 of transmit amplifier circuit 144, the amplified result is passed to switch circuit 146. Switch circuit 146 is similar to switch circuit 145 except that its configuration is reversed. More particularly, switch circuit 146 comprises switch device 170 which, according to the present embodiment can be the same type of device as switch device 160. The amplified RF signal from transmit amplifier circuit 144 is provided to switch device 170 on one of its input/output ports. When amplifier circuit 200 is in transmit mode, switch device 170 is controlled to pass the amplified RF signal from this input/output port through to another of its input/output ports which is connected to an antenna 150.

When amplifier circuit 200 is in receive mode, i.e., transmit mode enable signal 188 is inactive and receive mode enable signal 187 is active, antenna 150 receives RF signals transmitted from other transmission systems (not shown) and passes the received signal to switch circuit 146. Switch circuit 146 comprises switch device 170 which, when controlled to be in receive mode, i.e., when transmit mode enable signal 188 is inactive and receive mode enable signal 187 is active, switch 170 passes the received RF signal from the input/output port connected to antenna 150 on to LNA circuit 147. LNA circuit 147 comprises an integrated circuit (IC) LNA 175. In accordance with this exemplary embodiment, IC LNA 175 is a GaAs MMIC amplifier with a low noise figure and excellent gain for applications from 0.5 to 6 GHz. According to the present embodiment, LNA circuit 175 is packaged in an ultra-miniature package to minimize the amount of space used on the PCB.

After the received RF signal is amplified by LNA circuit 147, the amplified result is provided to filter circuit 148 which, in accordance with the present embodiment, comprises a 5.8 GHz band-pass filter (BPF) IC device 176. The output of BPF filter 176 is then provided to switch device 160 which, when in receive mode, transfers the output of BPF filter 176 through to input/output port 130 of the amplifier where it is then provided to the receiver equipment (not shown) for processing.

Figure 10:
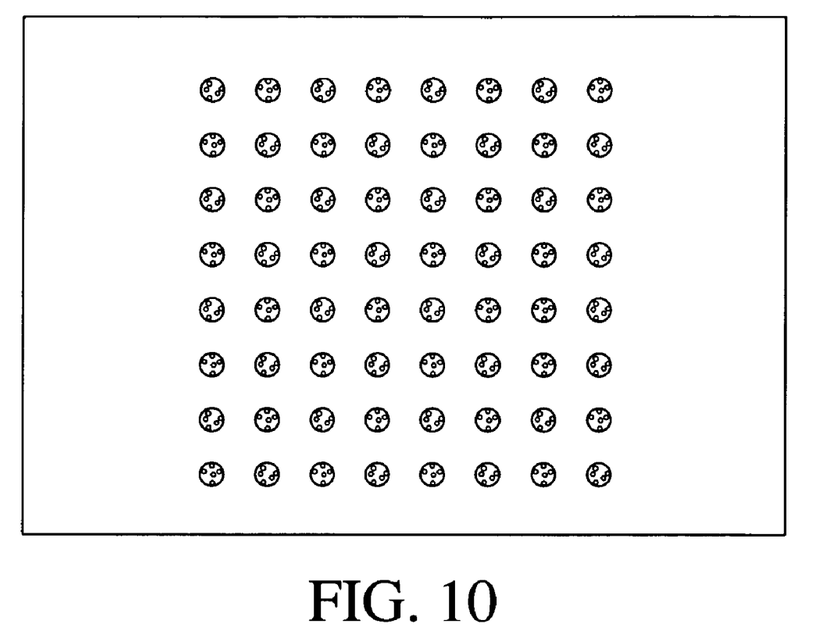
FIG. 10 is a constellation diagram representative of test results for tests performed on an amplifier in accordance with the present invention.

Additionally, it should be pointed out that the embodiment illustrated in FIGS. 8 and 9 is capable of achieving results that represent a significant improvement over that which has been achieved by related art amplifiers. For example, FIG. 10 illustrates a constellation plot with respect to achieved test results with respect to an amplifier utilizing 64 QAM at the maximum 802.11a data rate of 54 Mbps, in accordance with the present embodiment. When FIG. 10 is compared to FIG. 11, which illustrates typical results achieved during tests of related art devices utilizing 64 QAM a data rate of 54 Mbps, it can be seen that the results of the present embodiment are superior.

In particular, the components selected for the amplifier circuit 200 (FIG. 9) of this embodiment, as well as their respective placement within the circuit, were carefully selected to achieve the desired results for 5.8 GHz OFDM transmission as defined by the IEEE 802.11a standard. Additionally, electrical tuning of conductive micro-strips (not illustrated in FIG. 9), which comprise portions of the electrical connections between various components of the amplifier circuit 200 of this embodiment as well as the amplifier circuit 4 of FIG. 7, is tediously conducted using a special tuning procedure to achieve the desired results. For example, Finite-Element-Method Technology (FEM) is used to tune the micro-strips to achieve, among other things, a suitable 50 ohm impedance match with respect to the electrical components.

In regard to the embodiment of FIGS. 8 and 9, the constellation plot illustrated in FIG. 10 demonstrates the achieved accuracy of the modulation of an amplifier in accordance with the invention. OFDM modulation uses Quadrature Amplitude Modulation (QAM) to modulate the signal in the 5 GHz band. To achieve the 54 Mbps data rate dictated by the 802.11a standard, 64 QAM is applied. However, with respect to conventional amplifiers, when the 54 Mbps rate cannot be obtained, the radio is often controlled to employ 16 QAM, or another modulation technique, as opposed to the desired 64 QAM, resulting in a lower data rate than the desired 54 Mbps.

Figure 11:
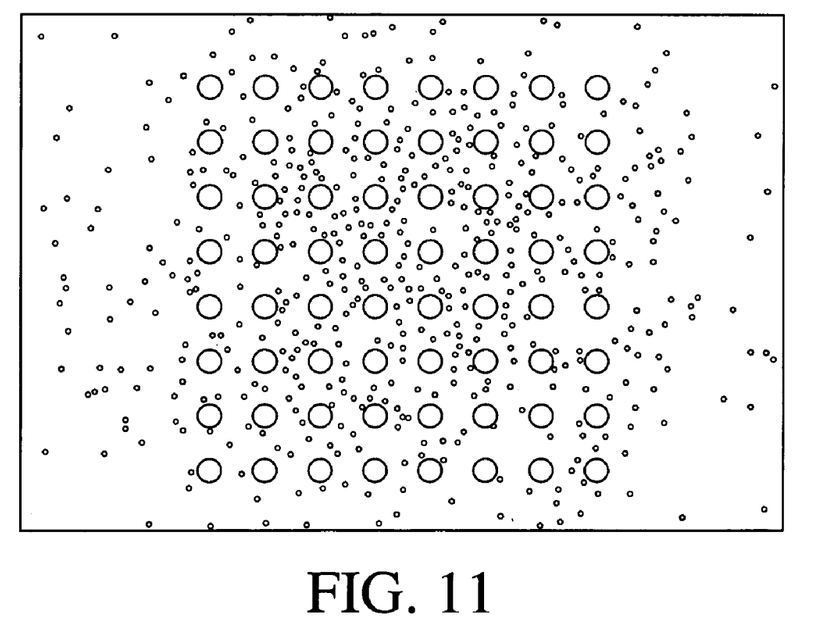
FIG. 11 is a constellation diagram representative of test results for tests performed on an amplifier in accordance with a conventional amplifier.

It is desired in the art that an amplifier not distort the signal and amplify the signal without inducing any noise. Thus, the constellation plot with respect to the amplifier should ideally be the same as the one defined by the IEEE 802.11a standard. Typically, however, regarding conventional amplifiers, a result substantially like the result defined by the 802.11a standard cannot be achieved due to noise being generated and added to the transmitted signal when electrical current travels through the electrical components of the amplifier. When the performance of the amplifier is not as defined by the Standard, the amplified signal will be distorted both in amplitude and in phase, as illustrated in FIG. 11.

With respect to the present invention, however, the transmitted signal is amplified with minimum distortion due to the careful selection of the components and their placement, as well as the tuning of the micro-strips, discussed above. In other words, in accordance with the present invention, the data rate of the signal does not diminish below the desired maximum rate due to poor performance of the amplifier and 64 QAM can be utilized continuously.

While various aspects of the present invention have been particularly shown and described with reference to the exemplary, non-limiting, embodiments above, it will be understood by those skilled in the art that various additional aspects and embodiments may be contemplated without departing from the spirit and scope of the present invention. For example, a skilled artisan would understand that certain alternative circuit components can be used to achieve similar results to those defined above.

It would be understood that a device or method incorporating any of the additional or alternative details mentioned above would fall within the scope of the present invention as determined based upon the claims below and any equivalents thereof.

Other aspects, objects and advantages of the present invention can be obtained from a study of the drawings, the disclosure and the appended claims.

What is claimed is:

1. A bi-directional amplifier device that can receive and transmit RF signals compatible with one or more of the IEEE 802.11 standards, the amplifier device comprising:
   an amplifier circuit having
      a RF sensor operable to determine whether the amplifier device is receiving an RF signal or transmitting an RF signal;
      a switch controller operable to generate switch control signals based on the determination of said RF sensor; and
      an RF switch operable to transmit a transmit RF signal from a first port of the amplifier device or transmit a receive RF signal to the first port depending on a condition of the switch control signals; and
   an enclosure device operable to house said amplifier circuit, wherein heat generated by said amplifier circuit when in operation is sufficiently dissipated through a smooth cylindrical surface of said enclosure device such that no additional heat dissipation devices are required to ensure proper operation of said amplifier circuit.

2. A bi-directional amplifier device as claimed in claim 1, wherein said amplifier circuit further comprises:
   a transmit amplifier operable to receive the transmit RF signal from said RF switch and amplify the transmit RF signal; and
   a receive amplifier operable to amplify the receive RF signal and provide the amplified receive RF signal to said RF switch.

3. A bi-directional amplifier device as claimed in claim 2, wherein said amplifier circuit further comprises one or more tunable micro-strips operable to impedance match respective inputs and outputs of electrical components depending on their respective dimensions.

4. A bi-directional amplifier device as claimed in claim 1, wherein said enclosure device comprises an integrated lightning arrestor for dissipating electrical current resulting from a lightning strike.

5. A bi-directional amplifier device as claimed in claim 1, wherein the amplifier device is compatible with the IEEE 802.11a standard and can amplify OFDM modulated RF signals at 5.8 GHz, without inducing significant distortion on the RF signal while achieving a data transmission rate of 54 Mpbs.

6. A bi-directional amplifier device as claimed in claim 5, wherein the OFDM modulation continuously utilizes 64 QAM.

7. An amplifier device as claimed in claim 1, wherein said enclosure device comprises a cylindrical metal housing.

8. An amplifier device as claimed in claim 7, wherein said cylindrical metal housing comprises a first portion to which said amplifier circuit is connected and a second portion that is hollow and which receives the first portion such that said circuit is completely enclosed.

9. An amplifier device as claimed in claim 8, wherein the first portion of said cylindrical metal housing comprises one or more gaskets at either side of said circuit and which mate with corresponding portions of the second portion of said cylindrical metal housing to render said cylindrical metal housing at least one of water-tight and air-tight.

10. An amplifier device as claimed in claim 9, wherein the first and second portions of said cylindrical metal housing comprise complementary threaded sections which mate with each other and create a seal using at least one of the gaskets.

11. An amplifier device as claimed in claim 8, wherein the first portion of said cylindrical metal housing comprises grooves on the surface thereof operable to carry heat away from said circuit.

12. An amplifier device as claimed in claim 8, wherein said cylindrical metal housing is less than or equal to six inches long and has a diameter that is less than or equal to three inches.

13. An amplifier device as claimed in claim 1, wherein said cylindrical metal housing comprises an integrated lightning arrestor operable to dissipate the electrical charge of a lightning strike.

14. An amplifier device as claimed in claim 13, wherein the integrated lightning arrestor comprises a gas tube.

* * * * *